US009613701B2

(12) United States Patent
Roy et al.

(10) Patent No.: US 9,613,701 B2
(45) Date of Patent: Apr. 4, 2017

(54) TERNARY CONTENT ADDRESSABLE MEMORY (TCAM) WITH PROGRAMMABLE RESISTIVE ELEMENTS

(71) Applicant: FREESCALE SEMICONDUCTOR, INC., Austin, TX (US)

(72) Inventors: Anirban Roy, Austin, TX (US); Michael A. Sadd, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 86 days.

(21) Appl. No.: 14/833,287

(22) Filed: Aug. 24, 2015

(65) Prior Publication Data

US 2017/0062052 A1 Mar. 2, 2017

(51) Int. Cl.
*G11C 15/00* (2006.01)
*G11C 15/04* (2006.01)

(52) U.S. Cl.
CPC .................. *G11C 15/046* (2013.01)

(58) Field of Classification Search
USPC ................ 365/49.1, 49.15, 49.16, 49.17
See application file for complete search history.

(56) References Cited

U.S. PATENT DOCUMENTS

| 7,675,765 | B2 * | 3/2010 | Derharcobian | G11C 11/5678 365/49.1 |
| 7,782,646 | B2 | 8/2010 | Lam et al. | |
| 8,107,276 | B2 * | 1/2012 | Breitwisch | G11C 13/0004 365/49.1 |
| 8,659,926 | B1 | 2/2014 | Derhacobian | |
| 9,230,649 | B2 * | 1/2016 | Chang | G11C 15/046 |
| 2014/0153310 | A1 | 6/2014 | Sekar et al. | |

OTHER PUBLICATIONS

Eshraghian et al, "Memristor MOS Content Addressable Memory (MCAM): Hybrid Architecture for Future High Performance Search Engines", IEEE Transactions on Very Large Scale Integration (VLSI) Systems, Aug. 2011, pp. 1407-1417, vol. 19, No. 8.
Guan et al, "On the Switching Parameter Variation of Metal-Oxide RRAM—Part I: Physical Modeling and Simulation Methodology", IEEE Transactions on Electron Devices, Apr. 2012, pp. 1172-1182, vol. 59, No. 4.

(Continued)

*Primary Examiner* — Trong Phan

(57) ABSTRACT

A content addressable memory device includes a first memory cell having three programmable resistive elements coupled in parallel. The first terminals of the first, second, and third programmable resistive elements are coupled to a first node, the second terminal of the first programmable resistive element coupled to a first source line voltage, the second terminal of the second programmable resistive element coupled to a second source line voltage, and the second terminal of the third programmable resistive element coupled to a first supply voltage. A first access transistor includes a first current electrode coupled to a bit line; a second current electrode coupled to the first node, and a control electrode coupled to a word line. A match line transistor includes a first current electrode coupled to a match line; a second current electrode coupled to a second supply voltage and a control electrode coupled to the first node.

20 Claims, 6 Drawing Sheets

(56) References Cited

OTHER PUBLICATIONS

Guo et al, "A Resistive TCAM Accelerator for Data-Intensive Computing", MICRO '11, Dec. 3-7, 2011, pp. 1-12.
Huang et al, "ReRAM-based 4T2R Nonvolatile TCAM with 7x NVM-Stress Reduction, and 4x Improvement in Speed-WordLength-Capacity for Normally-Off Instant-On Filter-Based Search Engines Used in Big-Data Processing", Symposium on VLSI Circuits Digest of Technical Papers, Jun. 10-13, 2014, pp. 1-2.
Pagiamtzis et al, "Content-Addressable Memory (CAM) Circuits and Architectures: A Tutorial and Survey", IEEE Journal of Solid-State Circuits, Mar. 2006, pp. 712-727, vol. 41, No. 3.
Renesas, "20Mbit QUAD-Search Content Addressable Memory", Renesas Electronics America Inc., 2010, pp. 1-2.
Xu et al, "Design of Spin-Torque Transfer Magnetoresistive RAM and CAM/TCAM with High Sensing and Search Speed", IEEE Transactions on Very Large Integration (VLSI) Systems, Jan. 2010, pp. 66-74, vol. 18, No. 1.
Onizawa et al., "Design of a Soft-Error Tolerant 9-Transistor/6-Magnetic-Tunnel-Junction Hybrid Cell Based Nonvolatile TCAM", 2014 IEEE 12th International New Cirucits and System Conference (NEWCAS), IEEE, (Jun. 22, 2014), pp. 193-196.
Xu et al., "Spin-Transfer Torque Magnetoresistive Content Addressable Memory (CAM) Cell Structure Design with Enhanced Search Noise Margin", Circuits and Systems, 2008, ISCAS 2008, IEEE International Symposium on, IEEE (May 18, 2008), pp. 1898-1901.

\* cited by examiner

|            | R302 | R303 | R304 | SL1   | SL2   | SLX1 |
|------------|------|------|------|-------|-------|------|
| MATCH 1    | HRS  | LRS  | HRS  | VREAD | VB    | VB   |
| MISMATCH 1 | HRS  | LRS  | HRS  | VB    | VREAD | VB   |
| MATCH 0    | LRS  | HRS  | HRS  | VB    | VREAD | VB   |
| MISMATCH 0 | LRS  | HRS  | LRS  | VREAD | VB    | VB   |
| DON'T CARE | HRS  | ANY  | HRS  | ANY   | ANY   | VB   |
| MASK       | ANY  | ANY  | ANY  | VB    | VB    | VB   |

TERNARY CONTENT ADDRESSABLE MEMORY (TCAM) WITH PROGRAMMABLE RESISTIVE ELEMENTS

BACKGROUND

1. Field

This disclosure relates generally to memories, and more specifically, to ternary content addressable memory (TCAM) with programmable resistive elements.

2. Related Art

A content addressable memory (CAM) is a type of memory that is typically used in high-speed search operations. For a search operation, a CAM compares input search data against a table including rows of stored data, and returns the address of the matching data. Two basic types of CAMs include a binary CAM (BCAM) and a ternary CAM (TCAM). In a BCAM, each bitcell stores one of two data states, a logic "1" or a logic "0", such that the input search data is compared with each row of the BCAM to determine whether the stored data of the row matches the input search data. In a TCAM, each bitcell stores one of three data states, a logic "1", a logic "0", or a "don't care" value, in that the "don't care" value results in a match of the bit regardless of the value of the input bit of the search data. In order to encode three data states, each TCAM bitcell is configured to store two bits.

BRIEF DESCRIPTION OF THE DRAWINGS

The present invention may be better understood, and its numerous objects, features, and advantages made apparent to those skilled in the art by referencing the accompanying drawings.

FIG. 4 illustrates a chart of example resistive states and associated search results of an example bitcell of the TCAM of FIG. 3, according to some embodiments.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

An example resistive random access memory (resistive RAM or RRAM) cell is implemented using a transistor and a programmable resistive element (also referred to as a 1T1R RRAM cell). The programmable resistive element is made of a dielectric solid-state material whose resistance can be changed using an appropriate voltage. Each programmable resistive element implements at least two levels of resistance (also referred to as resistive states): a high resistive state (HRS) and a low resistive state (LRS). RRAM technology is beneficial for implementation in non-volatile memory, due to its low power consumption, faster switching speeds than phase-change RAM (PRAM), and smaller cell structure than magnetoresistive RAM (MRAM). However, RRAM technology requires high voltages to change resistive state of the programmable resistive elements, which are larger than the voltages usually implemented in volatile memory systems. RRAM technology also requires dual gate oxide (DGO) transistors that can withstand the RRAM high voltages, which prevents one from merely replacing DGO transistors with logic transistors (or low voltage transistors), which cannot handle RRAM high voltages.

The present disclosure provides for a ternary content addressable memory (TCAM) that utilizes resistive RAM (RRAM) technology. Each TCAM bitcell utilizes programmable resistive elements to store two bits, which encode a data state of the TCAM bitcell. When input search data is applied at a TCAM bitcell, a match line of the TCAM bitcell indicates whether the data state stored by the TCAM bitcell matches the input search data. Programmable resistive elements are integrated into the TCAM bitcell in a gain-cell configuration, which uses a resistance ratio to drive the match line output and provides isolation for low voltage transistors from the RRAM technology (as opposed to using an RRAM cell to directly drive the match line output). Other embodiments provide different TCAM bitcell configurations to further reduce the size of TCAM bitcells, such as by reducing the number of transistors implemented in each TCAM bitcell, and reducing the size of the transistors implemented in each TCAM bitcell. Example TCAM bitcells that utilize programmable resistive elements are described below.

Example Embodiments

Figure 1:
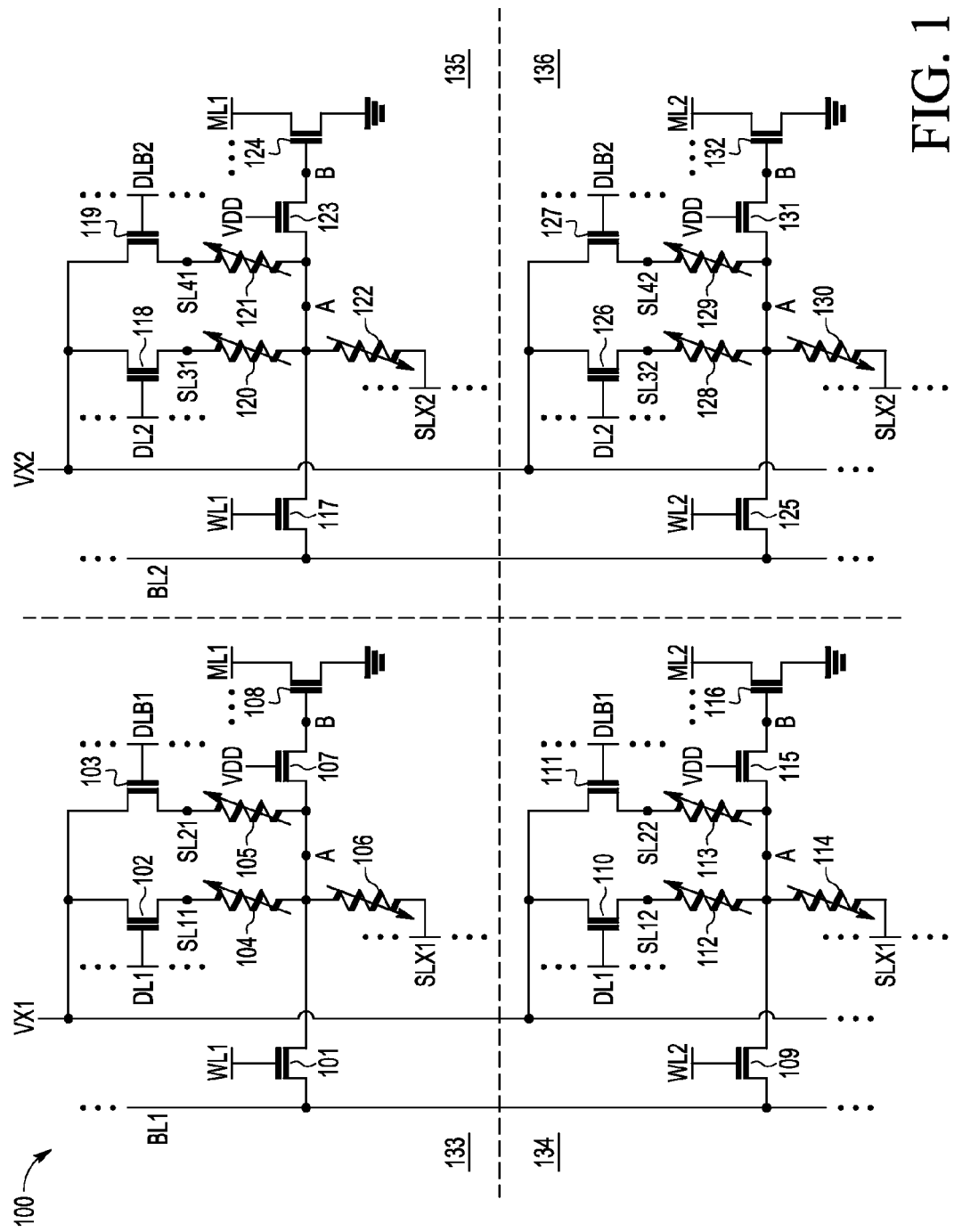
FIG. 1 illustrates a circuit diagram depicting an example ternary content addressable memory (TCAM) in which the disclosure is implemented, according to some embodiments.

FIG. 1 illustrates a circuit diagram depicting an example ternary content addressable memory (TCAM) 100 in which the disclosure is implemented. TCAM 100 includes a memory array having a plurality of bitcells arranged in N rows and M columns, with N and M being integers of one or more. TCAM 100 is a non-volatile memory, where each bitcell is configured to store two bits in a non-volatile manner. TCAM 100 also includes an N number of word lines (WL) that each correspond to a row of bitcells in TCAM 100, and an M number of bit lines (BL) that each correspond to a column of bitcells in TCAM 100. TCAM 100 also includes an N number of match lines (ML) that each correspond to a row of bitcells in TCAM 100. TCAM 100 also includes an M number of paired data lines, where each pair includes a true data line (DL) and a complementary data line (DLB), and where each pair of data lines correspond to a column of bitcells in TCAM 100. TCAM 100 also includes an M number of paired source or supply voltage lines (VX and SLX), where each pair of source lines correspond to a column of bitcells in TCAM 100.

Four example TCAM bitcells 133-136 are shown in a simplified 2×2 arrangement in FIG. 1 for ease of illustration and explanation, although TCAM 100 includes a much larger number of bitcells. In the embodiment of FIG. 1, each bitcell in TCAM 100 is coupled to a corresponding word line (WL), a corresponding bit line (BL), a corresponding match line (ML), a corresponding true data line (DL), and a corresponding complementary data line (DLB). Each bitcell is also coupled to a corresponding pair of source lines (VX and SLX). Each bitcell is also coupled to a supply voltage Vdd. Each bitcell also includes a pair of true and complementary search line nodes SL[i][k] and SL[j][k], where [i] is an odd integer of one or more and [j] is an even integer that follows [i]. The integer [k] is an integer of one or more. SL nodes that have a same [i] or [j] integer indicates inclusion in a common line of nodes, where [k] reflects a row position in the common line of nodes. As shown in FIG. 1, SL11 of bitcell 133 and SL12 of bitcell 134 are in a common line (as indicated by [i] equal to 1), and SL 21 and SL 22 of bitcells 133 and 134 are in a common line (as indicated by [i] equal to 2). The use of search line nodes SL during search operations is further discussed below in connection with FIG. 2. Search line nodes SL[i][k] and SL[j][k] may also be referred to as source line nodes, which are coupled to receive a source line voltage.

In the embodiment of FIG. 1, each bitcell includes a pair of programmable resistive elements (e.g., elements 104 and 105) that are each configured to store a bit in a non-volatile manner, where the two bits together indicate one of three possible data states: a logic level one state, a logic level zero state, and a don't care state. The pair of programmable resistive elements is coupled in parallel with one another, and each is coupled to a respective one of nodes SL[i][k] and SL[j][k]. An additional programmable resistive element (e.g., element 106) is also coupled in parallel with the pair of programmable resistive elements, where the additional programmable resistive element maintains a target resistive state and is coupled to source line SLX. During a TCAM search operation, true and complementary data lines DL and DLB of a bitcell receive input search data, which couples one of the pair of programmable resistive elements (or one of the SL nodes) to source line VX, while the other of the pair (or other SL node) floats. Depending on the resistive states of the pair of programmable resistive elements, a particular ratio of resistance is formed between the programmable resistive elements that are respectively coupled to source lines VX and SLX, which drives a corresponding voltage, which in turn drives the match line to indicate whether the bitcell stores a data state that matches the input search data.

In the embodiment of FIG. 1, each bitcell also includes a number of high voltage transistors that can withstand the high voltages used during program operations and erase operations that write the resistive states of the bitcell's programmable resistive elements. Each bitcell also includes a low voltage transistor coupled to the match line (or match line transistor) that is configured to pull down the match line to indicate a miss. The match line transistor is driven by the corresponding voltage provided by the resistance ratio of the programmable resistive elements. Each bitcell also includes another low voltage transistor coupled between the programmable resistive elements and a control electrode of the match line transistor to provide isolation between the match line transistor and any high voltages during program and erase operations. Program and erase operations of programmable resistive elements and search operations that result in a miss or a match are further discussed below in connection with FIG. 2.

Bitcell 133 includes three high voltage transistors 101, 102, and 103. In some embodiments, transistors 101, 102, and 103 are dual gate oxide (DGO) transistors having a thicker gate oxide layer than transistors 107 and 108. Bitcell 133 also includes three programmable resistive elements 104, 105 and 106. Bitcell 133 also includes two low voltage transistors 107 and 108 having a thin gate oxide layer. Transistor 101 (and transistors 109, 117, 125, and transistors of other bitcells that are similarly coupled to BL and WL) may be referred to as a write transistor. Transistors 102 and 103 (and transistors 110 and 111, 118 and 119, 126 and 127, and transistors of other bitcells that are similarly coupled between VX and programmable resistive elements) may be referred to as access transistors or data line transistors. Transistor 108 (and 116, 124, 132, and transistors of other bitcells that are similarly coupled between ML and ground) may be referred to as a match line transistor or a read transistor. Transistor 107 (and transistors 115, 123, 131 and transistors of other bitcells that are similarly coupled between parallel programmable resistive elements and a read transistor) may be referred to as an isolation transistor.

Transistor 101 has a first current electrode coupled to bit line BL1, a second current electrode coupled to node A, and a control electrode coupled to word line WL1. Transistor 102 has a first current electrode coupled to source line VX1, a second current electrode coupled to a search line node SL11, and a control electrode coupled to true data line DL1. Programmable resistive element 104 has a first terminal coupled to search line node SL11 (which can also be characterized as the first terminal of programmable resistive element 104 being coupled to the second current electrode of transistor 102) and a second terminal coupled to node A. Transistor 103 has a first current electrode coupled to source line VX1, a second current electrode coupled to a search line node SL21, and a control electrode coupled to complementary data line DLB1. Programmable resistive element 105 has a first terminal coupled to search line node SL21 (which can also be characterized as the first terminal of programmable resistive element 105 being coupled to the second current electrode of transistor 103) and a second terminal coupled to node A. Programmable resistive element 106 includes a first terminal coupled to node A and a second terminal coupled to source line SLX1. Transistor 107 has a first current electrode coupled to node A, a second current electrode coupled to a node B, and a control electrode coupled to supply voltage Vdd. Transistor 108 has a first current electrode coupled to match line ML1, a second current electrode coupled to ground, and a control electrode coupled to node B (which can also be characterized as the control electrode of transistor 108 being coupled to the second current electrode of transistor 107).

Bitcell 134 is in the same column as bitcell 133 and shares bit line BL1, source lines VX1 and SLX1, and data lines DL1 and DLB1. Transistor 109 has a first current electrode coupled to bit line BL1, a second current electrode coupled to node A, and a control electrode coupled to word line WL2. Transistor 110 has a first current electrode coupled to source line VX1, a second current electrode coupled to a search line node SL12, and a control electrode coupled to true data line DL1. Programmable resistive element 112 has a first terminal coupled to search line node SL12 (which can also be characterized as the first terminal of programmable resistive element 112 being coupled to the second current electrode of transistor 110) and a second terminal coupled to node A. Transistor 111 has a first current electrode coupled to source line VX1, a second current electrode coupled to a search line node SL22, and a control electrode coupled to complementary data line DLB1. Programmable resistive element 113 has a first terminal coupled to search line node SL22 (which can also be characterized as the first terminal of programmable resistive element 113 being coupled to the second current electrode of transistor 111) and a second terminal coupled to node A. Programmable resistive element 114 includes a first terminal coupled to node A and a second terminal coupled to source line SLX1. Transistor 115 has a first current electrode coupled to node A, a second current electrode coupled to a node B, and a control electrode coupled to supply voltage Vdd. Transistor 116 has a first current electrode coupled to match line ML2, a second current electrode coupled to ground, and a control electrode coupled to node B (which can also be characterized as the control electrode of transistor 116 being coupled to the second current electrode of transistor 115).

Bitcell 135 is in the same row as bitcell 133 and shares word line WL1 and match line ML1. Transistor 117 has a first current electrode coupled to bit line BL2, a second current electrode coupled to node A, and a control electrode coupled to word line WL1. Transistor 118 has a first current electrode coupled to source line VX2, a second current electrode coupled to a search line node SL31, and a control electrode coupled to true data line DL2. Programmable resistive element 120 has a first terminal coupled to search line node SL31 (which can also be characterized as the first terminal of programmable resistive element 120 being coupled to the second current electrode of transistor 118) and a second terminal coupled to node A. Transistor 119 has a first current electrode coupled to source line VX2, a second current electrode coupled to a search line node SL41, and a control electrode coupled to complementary data line DLB2. Programmable resistive element 121 has a first terminal coupled to search line node SL41 (which can also be characterized as the first terminal of programmable resistive element 121 being coupled to the second current electrode of transistor 119) and a second terminal coupled to node A. Programmable resistive element 122 includes a first terminal coupled to node A and a second terminal coupled to source line SLX2. Transistor 123 has a first current electrode coupled to node A, a second current electrode coupled to a node B, and a control electrode coupled to supply voltage Vdd. Transistor 124 has a first current electrode coupled to match line ML1, a second current electrode coupled to ground, and a control electrode coupled to node B (which can also be characterized as the control electrode of transistor 124 being coupled to the second current electrode of transistor 123).

Bitcell 136 is in the same row as bitcell 134 and shares word line WL2 and match line 2. Bitcell 136 is also in the same column as bitcell 135 and shares bit line BL2, source lines VX2 and SLX2, and data lines DL2 and DLB2. Transistor 125 has a first current electrode coupled to bit line BL2, a second current electrode coupled to node A, and a control electrode coupled to word line WL2. Transistor 126 has a first current electrode coupled to source line VX2, a second current electrode coupled to a search line node SL32, and a control electrode coupled to true data line DL2. Programmable resistive element 128 has a first terminal coupled to search line node SL32 (which can also be characterized as the first terminal of programmable resistive element 128 being coupled to the second current electrode of transistor 126) and a second terminal coupled to node A. Transistor 127 has a first current electrode coupled to source line VX2, a second current electrode coupled to a search line node SL42, and a control electrode coupled to complementary data line DLB2. Programmable resistive element 129 has a first terminal coupled to search line node SL42 (which can also be characterized as the first terminal of programmable resistive element 129 being coupled to the second current electrode of transistor 127) and a second terminal coupled to node A. Programmable resistive element 130 includes a first terminal coupled to node A and a second terminal coupled to source line SLX2. Transistor 131 has a first current electrode coupled to node A, a second current electrode coupled to a node B, and a control electrode coupled to supply voltage Vdd. Transistor 132 has a first current electrode coupled to match line ML2, a second current electrode coupled to ground, and a control electrode coupled to node B (which can also be characterized as the control electrode of transistor 132 being coupled to the second current electrode of transistor 131).

Figure 2:
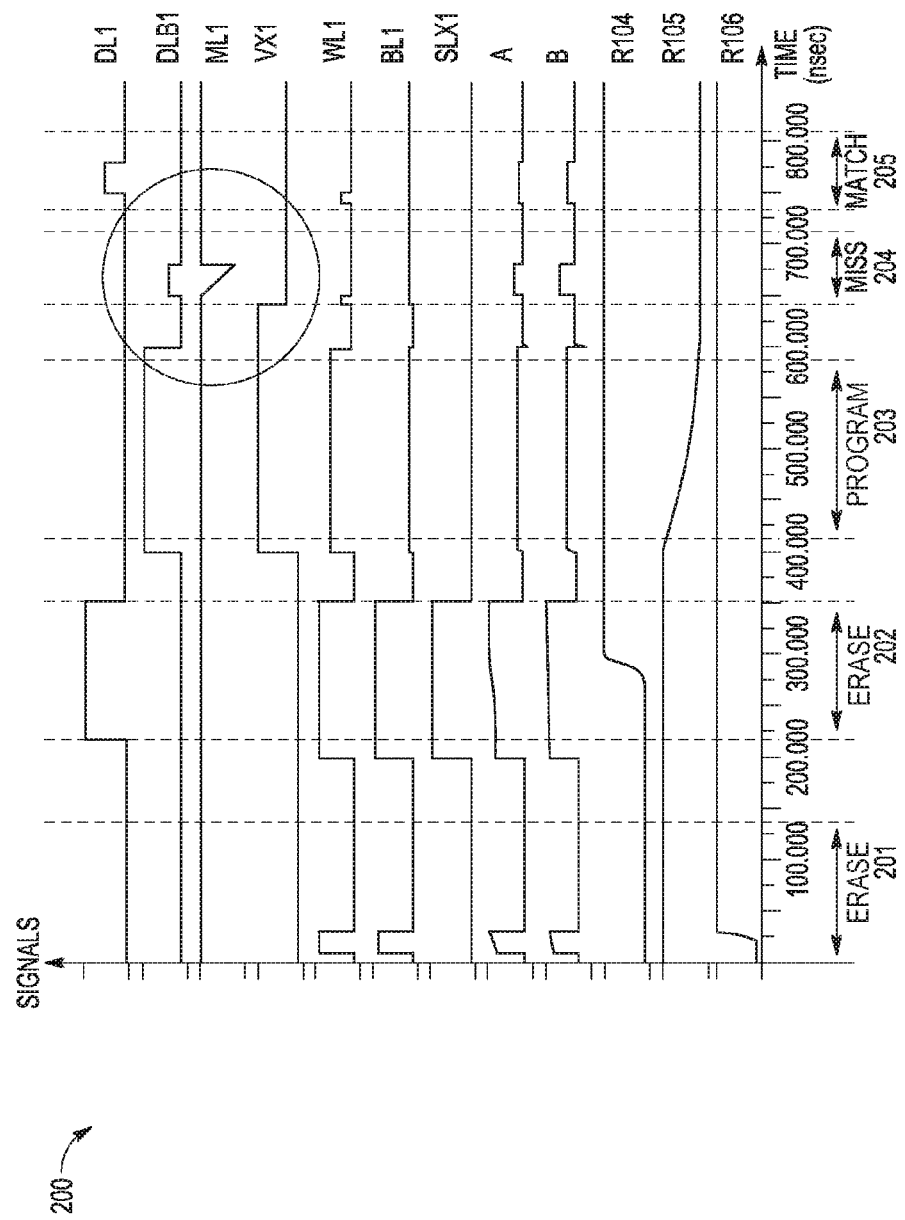
FIG. 2 illustrates a waveform diagram depicting example voltages present at a plurality of nodes in an example bitcell of the TCAM of FIG. 1 when performing various example operations, according to some embodiments.

FIG. 2 illustrates a waveform diagram 200 of example voltages present at a plurality of nodes of an example bitcell of TCAM 100 of FIG. 1 when performing various example operations, such as program and erase operations and search operations. FIG. 2 displays the example voltages over time as signals (as indicated by the axis labeled SIGNALS and the axis labeled TIME(nsec), indicating nanoseconds), and illustrates an example erase operation 201 (also labeled as ERASE 201), an example erase operation 202 (also labeled as ERASE 202), an example program operation 203 (also labeled as PROGRAM 203), an example search operation 204 resulting in a miss (also labeled as MISS 204), and an example search operation 205 resulting in a match (also labeled as MATCH 205). Each operation 201-205 is implemented using a respective set of voltages present at nodes in the bitcell, including DL, DLB, VX, WL, BL, and SLX, which produce corresponding voltages on nodes A and B. It is noted that since transistor 107 receives Vdd on its control electrode and is conducting (completing the connection between nodes A and B), the voltage at node B follows the voltage at node A with minimal delay. Search operations also produce a corresponding output on ML. Since the bitcells of TCAM 100 have comparable structures, FIG. 2 is discussed using bitcell 133 as an example bitcell, using the reference numbers of bitcell 133 from FIG. 1. Although example sets of voltages for each operation are discussed herein, the operations are not limited thereto.

Erase operation 201, erase operation 202, and program operation 203 are used to write resistive states in programmable resistive elements 104, 105, and 106 (also respectively referred to as R104, R105, and R106). The resistive states of R104 and R105 (and other programmable resistive elements in the same position in respective bitcells) represent or encode a data state stored by the bitcell. In the embodiments described herein, R104 and R105 are implemented as having substantially the same high resistive state (HRS) and low resistive state (LRS). In other words, when both R104 and R105 are reset to HRS or both are programmed to LRS, the resistance of R104 is substantially equivalent to the resistance of R105.

Erase operation 201 is performed at wafer sort on each programmable resistive element in TCAM 100 that corresponds to R106 of bitcell 133 (e.g., during a testing phase of TCAM 100 while still in wafer form, prior to run-time operation of TCAM 100). In the TCAM of FIG. 1, erase operation 201 initializes R106 to a target resistive state that will be held by R106 during run-time operation of TCAM 100. The target resistive state of R106 is equivalent to half of HRS of R104 and R105. In other words, when R106 is reset to the target resistive state, the resistance of R106 is substantially equivalent to half of the resistance of R104 (or R105) when R104 (or R105) is reset to HRS.

Erase operation 202 and program operation 203 are utilized to write resistive states in R104 and R105 during run-time of TCAM 100. Operations 202 and 203 may be reordered and applied to R104 and R105 in different combinations in order to store different data states in bitcell 133. To store a logic level one state in bitcell 133, erase operation 202 resets R104 to HRS, and program operation 203 sets R105 to LRS subsequent to erase operation 202. To store a logic level zero state in bitcell 133, erase operation 202 resets R105 to HRS, and program operation 203 sets R104 to LRS subsequent to operation 202. To store a don't care state in bitcell 133, erase operation 202 resets R104 to HRS, and a second iteration of erase operation 202 resets R105 to HRS subsequent to operation 202 on R104. Operations 201, 202, and 203 are discussed below.

Erase operation 201 is performed on R106 to write a target resistive state that is half of the HRS of R104 and R105. During erase operation 201, VX1 receives a read voltage (Vread) and SLX1 is grounded (or set to 0V). The nodes at DL1 and DLB1 are also grounded, which breaks the connection to VX1 and leaves elements R104 and R105 floating. WL1 receives a pulse of a word line erase voltage (VWLerase) and BL1 receives a pulse of a reset or erase voltage (Vreset). VWLerase is a large enough voltage (e.g., 4V) to transfer Vreset from the first electrode to the second electrode of transistor 101. Thus, the voltage at node A goes high to a voltage that is substantially equivalent to Vreset. R106 is coupled to node A and is reset to the target resistive state, where a voltage across R106 is substantially equivalent to Vreset.

Erase operation 202 is performed on a programmable resistive element (such as either R104 or R105) to write HRS. During erase operation 202 on R104, VX1 is grounded and SLX1 receives Vdd. WL1 receives VWLerase and BL1 receives Vreset. Since node A is coupled to BL1 via transistor 101, the voltage at node A goes high to a voltage substantially equivalent to Vreset. The voltage across R106 is substantially equivalent to Vreset minus Vdd, which reinforces R106 to remain in its target resistance state. DL1 receives a pulse greater than 2V to complete the connection to VX1, while DLB1 is grounded, which breaks the connection to VX1 and leaves R105 floating. It is noted that the pulse on DL1 is delayed (as compared with the voltages on WL1 and BL1) to ensure that Vreset is established at node A and any current path from Vdd to ground through R106. R104 is coupled between Vreset at node A and ground at VX1, which resets R104 to HRS.

Program operation 203 is performed on a programmable resistive element (such as R104 or R105) to write LRS. During program operation 203 on R105, VX1 receives a set or program voltage (Vset) and SLX1 is grounded. DL1 is also grounded, which breaks the connection to VX1 and leaves R104 floating. DLB1 receives VWLerase, which completes the connection to VX1. WL1 receives a voltage greater than 2V and BL1 is coupled to a current sink that pulls a compliance current (Icomp) to ground. Since node A is coupled to BL1 via transistor 101, the voltage at node A goes low to a voltage substantially equivalent to ground. R106 has minimal voltage across it during operation 203. R105 is coupled between Vset at VX1 and ground at node A, which sets R105 to LRS.

Erase operation 202 can also be performed on R105 to write HRS, where the roles of DL1 and DLB1 are reversed, as compared to the erase operation 202 performed on R104 (as described above). Program operation 203 can also be performed on R104 to write LRS, where the roles of DL1 and DLB1 are reversed, as compared to the program operation 203 performed on R104 (as described above).

Search operations, like operations 204 and 205, determine whether the data state stored in a bitcell of TCAM 100 matches input search data. During a search operation like operations 204 and 205, DL and DLB of a bitcell respectively receive true and complementary input search data that encodes an input data state being searched. DL and DLB control a particular voltage (provided by source line VX) on a respective search line node SL, which represents the input data state being searched. For example, DL and DLB are respectively coupled to true and complementary search lines, which couples one of the pair of search line nodes (SL11 or SL21) to source line VX, while the other node of the pair floats. Depending on the resistive states of the pair of programmable resistive elements, a particular ratio of resistance is formed between the programmable resistive elements that are respectively coupled to source lines VX and SLX, which drives a corresponding voltage at node B. Node B is coupled to a control electrode of a match line transistor, where the corresponding voltage at node B drives the match line transistor to indicate whether the bitcell stores a data state that matches the input data state. If there is a match, match line ML of the bitcell is high. If there is not a match, match line ML is pulled low. Also, if the bitcell stores a "don't care" state, then the bitcell behaves in a same manner as a match case. It is noted that during a special search operation, or mask operation, the input search data is not true and complementary (e.g., DL and DLB receive a same value on the search lines), further discussed below.

For the purpose of explanation of search operations 204 and 205, bitcell 133 stores a data state of logic level one state (e.g., R104=HRS, R105=LRS), search operation 204 compares logic level zero state with the bitcell's stored data state to result in a miss, and search operation 205 compares logic level one state with the bitcell's stored data to result in a match. It is noted that these are example data states and that the bitcell 133 and operations 204 and 205 are not limited to such data states.

During search (miss) operation 204, VX1 receives read voltage (Vread). BL1 and SLX1 receive voltage Vb (e.g., 0 to 0.2V). Node A is precharged to Vb by pulsing WL1 with Vdd. ML1 is also precharged to a logic high level. In this example, DL1 and DLB1 receive input search data representing a logic level zero state, where DL1 receives a voltage representing a logic "0" (which breaks the connection between VX1 and node SL11, leaving R104 essentially floating, or at most SL11 receives Vb) and DLB1 receives a voltage representing a logic "1" (which completes the connection between VX1 and SL21). R105 is in LRS and is coupled between Vread and node A. Since R105 provides a small (or low) resistance, node A quickly charges high to a voltage substantially equivalent to Vread. The voltage at node B follows node A and also goes high to Vread, turning transistor 108 on (or conducting) and pulling down ML1 to indicate a miss (e.g., the logic level one state stored by the bitcell does not match the logic level zero state of the input search data). A similar result (or miss) is achieved when the bitcell stores a logic level zero state that does not match a logic level one state of the input search data.

During search (match) operation 205, VX1 receives Vread. BL1 and SLX1 receive Vb, and node A is precharged to Vb by pulsing WL1 with Vdd. ML1 is also precharged to a logic high level. DL1 and DLB1 receive input search data, such as DL1 receiving a voltage representing a logic "1" (which completes the connection between VX1 and node SL11) and DLB1 receiving a voltage representing a logic "0" (which breaks the connection between VX1 and SL21, which leaves R105 floating, or at most SL21 receives Vb), which represents a logic level one state. R104 is in HRS and is coupled between Vread and node A. Since R104 provides a large (or high) resistance, node A slow charges to a voltage substantially equivalent to (Vread+2Vb)/3. The voltage at node B follows node A and remains low enough to keep transistor 108 off (or non-conducting). ML1 remains high to indicate a match (e.g., the logic level one state stored by the bitcell matches the logic level one state of the input search data). A similar result (or match) is achieved when the bitcell stores a logic level zero state that matches a logic level zero state of the input search data.

A search operation may also be performed when bitcell 133 stores a don't care state (R104=HRS, R105=HRS), which results in a match regardless of the input search data. During the search (don't care) operation, VX1 receives Vread, BL1 and SLX1 receive Vb, node A is precharged to Vb, and ML1 is precharged to a logic high level. Since DL1 and DLB1 receive true and complementary input search data, one of DL1 and DLB1 will receive a logic "1" to complete the connection to VX1. Since both R104 and R105 are at HRS, one of R104 and R105 will have a complete connection to VX1 and is coupled between Vread and node A, and the other will be floating (or at most be coupled between Vb and node A). WL1 is pulsed with Vdd. Since the one of R105 and R104 that is coupled between Vread and node A provides a large (or high) resistance, node A slow charges to a voltage substantially equivalent to (Vread+Vb)/2. The voltage at node B follows node A and remains low enough to keep transistor 108 off. ML1 remains high to indicate a match (e.g., the don't care state stored by the bitcell "matches" the input data state of the input search data).

A special search operation, or mask operation, may also be performed to provide masked search results, which results in a match regardless of the data state stored by the bitcell. During the mask operation, VX1 receives Vread, BL1 and SLX1 receive Vb, node A is precharged to Vb by pulsing WL1 with Vdd, and ML1 is precharged to a logic high level. DL1 and DLB1 both receive a logic "0" to break the connection to VX1. Since both R104 and R105 are floating (or at most receive Vb at nodes SL11 and SL21), node A stays at Vb, regardless of the resistive states stored by R104 and R105. The voltage at node B follows node A and remains low enough to keep transistor 108 off. ML1 remains high to indicate a match (e.g., the data state stored by the bitcell is ignored).

Figure 3:
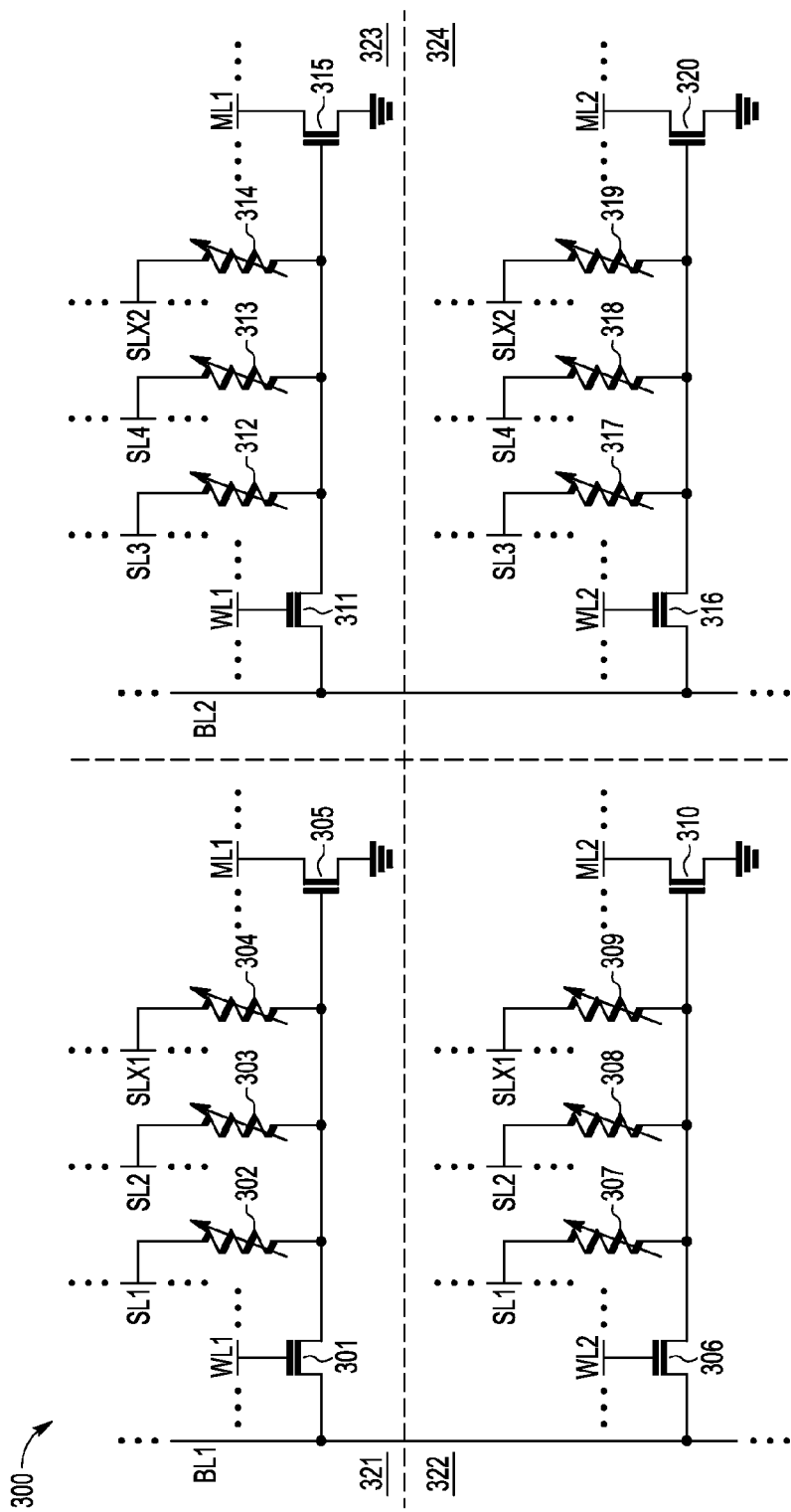
FIG. 3 illustrates a circuit diagram depicting another example TCAM in which the disclosure is implemented, according to some embodiments.

FIG. 3 illustrates a circuit diagram depicting another example TCAM 300 in which the disclosure is implemented. TCAM 300 also includes a memory array having a plurality of non-volatile bitcells arranged in N rows and M columns, with N and M being integers of one or more. TCAM 300 includes an N number of word lines (WL), an N number of match lines (ML), an M number of bit lines (BL), an M number of paired source or supply voltage lines (VX and SLX), and an M number of paired true and complementary data lines (DL and DLB). TCAM 300 also includes a number search line nodes SL, as further discussed below. In some embodiments, supply voltage circuitry that includes supply voltage lines VX and paired data lines DL and DLB is moved to the periphery of TCAM 300, where the supply voltage circuitry controls a voltage connection to each of the SL nodes of the bitcells of TCAM 300. The supply voltage circuitry opens or closes each respective voltage connection, which determines whether the respective SL node is floating or receives a source voltage VX.

Four example TCAM bitcells 321-324 are shown in a simplified 2×2 arrangement in FIG. 3 for ease of illustration and explanation, although TCAM 300 includes a much larger number of bitcells. In the embodiment of FIG. 3, each bitcell in TCAM 300 is coupled to a corresponding WL, BL, ML, DL, DLB, VX, and SLX. Each bitcell also includes a pair of true and complementary search line nodes SL[i] and SL[j], where [i] is an odd integer of one or more and [j] is an even integer that follows [i]. As shown in FIG. 3, SL1 and SL2 are common to bitcells 321 and 322 (e.g., part of a common source (node) line), and SL3 and SL4 are common to bitcells 323 and 324.

In a manner similar to that discussed above in connection with FIG. 1, each bitcell of TCAM 300 includes a pair of programmable resistive elements that together store one of three data states. Each of the pair of programmable resistive elements is coupled to a respective one of the nodes SL[i] and SL[j]. During a TCAM search operation, one of the nodes SL[i] and SL[j] (or respective programmable resistive element) is coupled to source line VX, while the other node (or programmable resistive element) floats. Depending on the resistive states of the pair of programmable resistive elements, a particular resistance ratio is formed that drives a corresponding voltage, which in turn drives the match line to indicate search results.

In the embodiment of FIG. 3, each bitcell includes a number of IO (input/output) oxide transistors that include one oxide layer, which can withstand the high voltages used during writing operations (e.g., program and erase operations to write resistive states) and are not as large as dual gate oxide (DGO) transistors. It is noted that the embodiment of FIG. 3 includes fewer transistors in each bitcell, as compared to the embodiment of FIG. 1. An extra program operation (are compared to the embodiment of FIG. 1) is also needed during run-time operation of TCAM 300 to change the resistive state of the additional programmable resistive element (e.g., the resistive state of the additional programmable resistive element is not initialized at wafer sort and does not necessarily remain at a target resistive element throughout run-time operation of TCAM 300), as further discussed below.

Bitcell 321 includes two transistors 301 and 305. In some embodiments, transistors 301 and 305 are IO oxide transistors. Transistor 301 (and other transistors similarly coupled to WL and BL) may be referred to as a write transistor, and transistor 305 (and other transistors similarly coupled between ML and ground) may be referred to as a match line transistor or a read transistor. Bitcell 321 also includes three programmable resistive elements 302, 303, and 304.

Transistor 301 has a first current electrode coupled to BL1, a second current electrode coupled to a common node, and a control electrode coupled to WL1. Programmable resistive element 302 has a first terminal coupled to SL1 and a second terminal coupled to the common node. Programmable resistive element 303 has a first terminal coupled to SL2 and a second terminal coupled to the common node. Programmable resistive element 304 has a first terminal coupled to SLX1 and a second terminal coupled to the common node. Transistor 305 has a first current electrode coupled to ML1, a second current electrode coupled to ground, and a control electrode coupled to the common node (which can also be characterized as being coupled to the second current electrode of transistor 101).

Bitcell 322 is in the same column as bitcell 321 and shares BL1, SL1, SL2, and SLX1. Transistor 306 has a first current electrode coupled to BL1, a second current electrode coupled to a common node, and a control electrode coupled to WL2. Programmable resistive element 307 has a first terminal coupled to SL1 and a second terminal coupled to the common node. Programmable resistive element 308 has a first terminal coupled to SL2 and a second terminal coupled to the common node. Programmable resistive element 309 has a first terminal coupled to SLX1 and a second terminal coupled to the common node. Transistor 310 has a first current electrode coupled to ML2, a second current electrode coupled to ground, and a control electrode coupled to the common node (which can also be characterized as being coupled to the second current electrode of transistor 306).

Bitcell 323 is in the same row as bitcell 321 and shares WL1 and ML1. Transistor 311 has a first current electrode coupled to BL2, a second current electrode coupled to a common node, and a control electrode coupled to WL1. Programmable resistive element 312 has a first terminal coupled to SL3 and a second terminal coupled to the common node. Programmable resistive element 313 has a first terminal coupled to SL4 and a second terminal coupled to the common node. Programmable resistive element 314 has a first terminal coupled to SLX2 and a second terminal coupled to the common node. Transistor 315 has a first current electrode coupled to ML1, a second current electrode coupled to ground, and a control electrode coupled to the common node (which can also be characterized as being coupled to the second current electrode of transistor 311).

Bitcell 324 is in the same row as bitcell 322 and shares WL2 and ML2. Bitcell 324 is also in the same column as bitcell 323 and shares BL2, SL3, SL4, and SLX2. Transistor 316 has a first current electrode coupled to BL2, a second current electrode coupled to a common node, and a control electrode coupled to WL2. Programmable resistive element 317 has a first terminal coupled to SL3 and a second terminal coupled to the common node. Programmable resistive element 318 has a first terminal coupled to SL4 and a second terminal coupled to the common node. Programmable resistive element 319 has a first terminal coupled to SLX2 and a second terminal coupled to the common node. Transistor 320 has a first current electrode coupled to ML2, a second current electrode coupled to ground, and a control electrode coupled to the common node (which can also be characterized as being coupled to the second current electrode of transistor 316).

FIG. 4 illustrates a chart of example resistive states and associated search results of an example bitcell of the TCAM 300 of FIG. 3. Programmable resistive elements 302, 303, and 304 are also respectively referred to as R302, R303, and R304. In the embodiments described herein, R302, R303, and R304 are implemented as having substantially the same high resistive state (HRS) and low resistive state (LRS). In other words, when R302, R303, and R304 are reset to HRS or are programmed to LRS, each resistance of R302, R303, and R304 are substantially equivalent (or the same). Since the bitcells of TCAM 300 have comparable structures, FIG. 4 is discussed using bitcell 321 as an example bitcell, using the reference numbers of bitcell 321 from FIG. 3. In the example search operations discussed below, the common node is precharged to Vb, ML1 is precharged to a logic high level, and SLX1 receives Vb. Input search data is represented by voltages provided at nodes SL1 and SL2.

Search operations performed on TCAM 300 are similar to those discussed above in connection with TCAM 100. During a first example search operation (which results in a match) shown in the first entry of the chart labeled MATCH 1, R302 is in HRS and R303 is in LRS (which represents a logic level zero state), and R304 is in HRS. In this example, SL1 receives Vread and SL2 receives Vb. Since R303 (which is in LRS and coupled to SL1=Vb) provides a small (or low) resistance, the common node charges to a resulting voltage that remains low enough to keep transistor 305 off (or non-conducting), and ML1 remains high to indicate a match.

During another example search operation (which results in a miss) shown in the second entry of the chart labeled MISMATCH 1, R302 is in HRS and R303 is in LRS (representing a logic level zero state), and R304 is in HRS. In this example, SL1 receives Vb and SL2 receives Vread (representing input data state of logic level one state). Since R303 (which is in LRS and coupled to SL2=Vread) provides a small (or low) resistance, the common node fast charges to Vread and turns transistor 305 on (or conducting), which pulls down ML1 to indicate a miss.

During another example search operation (which results in a match) shown in the third entry of the chart labeled MATCH 0, R302 is in LRS and R303 is in HRS (which represents a logic level one state), and R304 is in HRS. In this example, SL1 receives Vb and SL2 receives Vread (which represents an input data state of logic level one state). Since R302 (which is in LRS and coupled to SL1=Vb) provides a small (or low) resistance, the common node charges to a resulting voltage that remains low enough to keep transistor 305 off (or non-conducting), and ML1 remains high to indicate a match.

During another example search operation (which results in a miss) shown in the fourth entry of the chart labeled MISMATCH 0, R302 is in LRS and R303 is in HRS (representing a logic level one state), and R304 is in HRS. In this example, SL1 receives Vread and SL2 receives Vb (representing input data state of logic level zero state). Since R302 (which is in LRS and coupled to SL1=Vread) provides a small (or low) resistance, the common node fast charges to Vread and turns transistor 305 on (or conducting), which pulls down ML1 to indicate a miss.

During another example search operation (which results in a match, regardless of the values of SL1 and SL2, labeled as ANY) shown in the fifth entry of the chart labeled DON'T CARE, both R302 and R303 are in HRS (representing a don't care state), and R304 is in LRS. Since SL1 and SL2 are true and complementary inputs, one of SL1 and SL2 will receive Vread. Since R304 (which is in LRS and is coupled to SLX=Vb) provides a small resistance, the common node charges to a resulting voltage low enough to keep transistor 305 off (or non-conducting), and ML1 remains high to indicate a match.

Also, during a special search operation, or mask operation (which results in a match, regardless of the resistive states stored by R302 and R303, labeled as ANY) shown in the final entry of the chart labeled MASK, both R302 and R303 may have any resistive state (LRS or HRS) and R304 is in HRS, while SL1, SL2, and SLX1 receive Vb. Together, R302 and R303 provide at most Vb to charge the common node, which remains low enough to keep transistor 305 off (or non-conducting) and ML1 remains high to indicate a match.

It is also noted that the resistive states of the programmable resistive elements in TCAM 300 are written in a manner similar to that discussed in connection with TCAM 100. Example writing operations are provided herein in Table 1 and are discussed using the reference numbers from FIG. 3. Each entry of Table 1 indicates a respective set of voltages applied at nodes in a given bitcell, such as at bitcell 321, to write a resistive state (e.g., HRS or LRS) of one of the bitcell's programmable resistive elements R302, R303, or R304 (e.g., by performing an erase operation or a program operation). The voltages Vover1 and Vover2 are not necessarily the same voltages. Vreset+Vover1 is applied at transistor 301 during an erase operation and is a large enough voltage to transfer Vreset from the bitline BL1 to the common node (e.g., Vreset+Vover1 is equivalent to VWLerase, discussed above in connection with FIG. 1). Vover2 is applied at transistor 301 during a program operation and is a voltage greater than 2V to complete the connection between BL1 and the common node. The entries indicated as "float" may introduce disturb paths that limit the number of wordlines in some embodiments.

TABLE 1

Writing operations for bitcells in TCAM 300

| Operation | BL | WL | SL[i] | SL[j] | SLX |
|---|---|---|---|---|---|
| R302 to HRS | Vreset | Vreset + Vover1 | 0 | Float | Float |
| R302 to LRS | 0 | Vover2 | Vset | Float | Float |
| R303 to HRS | Vreset | Vreset + Vover1 | Float | 0 | Float |
| R303 to LRS | 0 | Vover2 | 0 | Vset | 0 |
| R304 to HRS | Vreset | Vreset + Vover1 | Float | Float | 0 |
| R304 to LRS | 0 | Vover2 | Float | Float | Vset |

The voltages present at nodes in other bitcells in TCAM 300 depend upon whether the other bitcells share a wordline or bitline with the bitcell being written. For example, during any of the writing operations shown in Table 1, bitcells that share the same bitline BL1 as bitcell 321 (e.g., bitcell 322 on the same bitcell column) also share the same BL1, SL1, SL2 and SLX1 voltages, while WL2 is grounded for bitcell 322. Similarly, bitcells that share the same wordline WL1 (e.g., bitcell 323 on the same bitcell row) also share the same WL1 voltage, while BL2, SL3, SL4, and SLX2 are grounded for bitcell 323. Finally, bitcells that do not share the same BL1 or WL1 (e.g., bitcell 324 that is on a different bitcell column and row) have BL2, WL2, SL3, SL4, and SLX2 grounded. By grounding nodes of the bitcells that do not share the same bitline or wordline as the bitcell being written, any disturbance of the stored data states of those bitcells is minimized.

Figure 5:
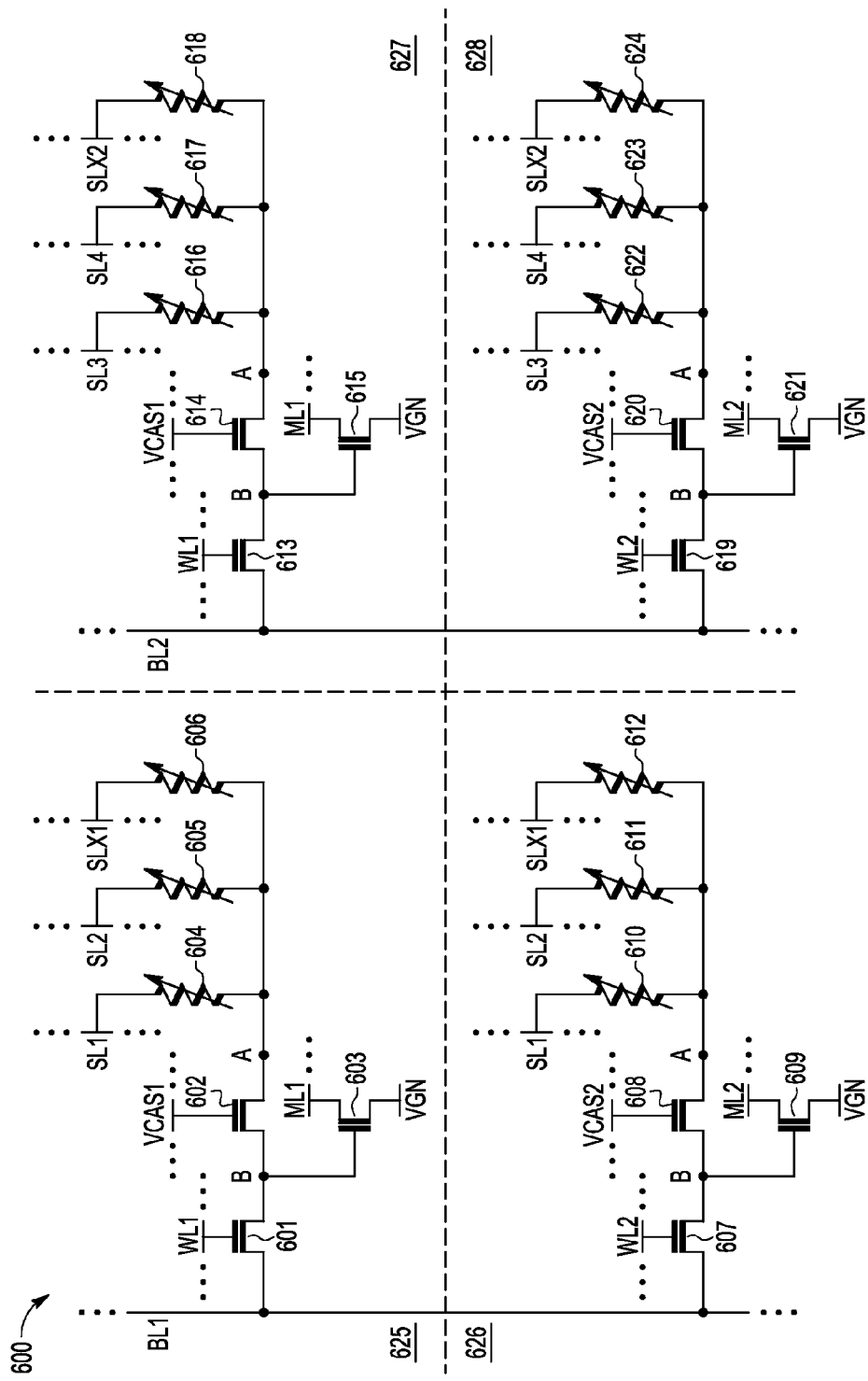
FIG. 5 illustrates a circuit diagram depicting another example TCAM in which the disclosure is implemented, according to some embodiments.

FIG. 5 illustrates a circuit diagram depicting another example TCAM 600 in which the disclosure is implemented. TCAM 600 also includes a memory array having a plurality of non-volatile bitcells arranged in N rows and M columns, with N and M being integers of one or more. TCAM 600 includes an N number of word lines (WL), an N number of match lines (ML), an M number of bit lines (BL), an M number of paired source or supply voltage lines (VX and SLX), and an M number of paired true and complementary data lines (DL and DLB). TCAM 600 also includes an N number of cascode lines (Vcas). In some embodiments, supply voltage lines VX and paired data lines DL and DLB of TCAM 600 are moved to the periphery of TCAM 600, as discussed above in connection with FIG. 3.

Four example TCAM bitcells 625-628 are shown in a simplified 2×2 arrangement in FIG. 5 for ease of illustration and explanation, although TCAM 600 includes a much larger number of bitcells. In the embodiment of FIG. 5, each bitcell in TCAM 600 is coupled to a corresponding WL, BL, ML, DL, DLB, VX, Vcasc, and SLX. Each bitcell also includes a pair of true and complementary search line nodes SL[i] and SL[j], where [i] is an odd integer of one or more and [j] is an even integer that follows [i]. As shown in FIG. 5, SL1 and SL2 are common to bitcells 625 and 626 (e.g., part of a common source (node) line), and SL3 and SL4 are common to bitcells 627 and 628.

In a manner similar to that discussed above in connection with FIGS. 1 and 3, each bitcell of TCAM 600 includes a pair of programmable resistive elements that together store one of three data states. Each of the pair of programmable resistive elements is coupled to a respective one of the nodes SL[i] and SL[j]. During a TCAM search operation, one of the nodes SL[i] and SL[j] (or respective programmable resistive element) is coupled to source line VX, while the other node (or programmable resistive element) floats. Depending on the resistive states of the pair of programmable resistive elements, a particular resistance ratio is formed that drives a corresponding voltage, which in turn drives the match line to indicate search results.

In the embodiment of FIG. 5, each bitcell includes a number of thin oxide transistors that are cascoded, which can withstand the high voltages used during writing operations (e.g., program and erase operations to write resistive states) and are not as large as dual gate oxide (DGO) transistors. It is noted that the embodiment of FIG. 5 includes smaller transistors in each bitcell, as compared to the embodiment of FIG. 1. An extra program operation (as compared with the embodiment of FIG. 1) is also needed during run-time operation of TCAM 600 to change the resistive state of the additional programmable resistive element (e.g., the resistive state of the additional programmable resistive element is not initialized at wafer sort and does not necessarily remain at a target resistive element throughout run-time operation of TCAM 600), as further discussed below.

Bitcell 625 includes three transistors 601, 602, and 603, and three programmable resistive elements 604, 605, and 606 (also respectively referred to as R604, R605, and R606, where a preceding R indicates a programmable resistive element, which is utilized herein to identify reference numbers of programmable resistive elements). In some embodiments, transistors 601 and 603 are thin oxide transistors, while transistor 602 may be a larger transistor than transistors 601 and 603. Transistor 601 (and other transistors similarly coupled to WL and BL) may be referred to as a write transistor, transistor 603 (and other transistors similarly coupled between ML and Vgn) may be referred to as a match line transistor or a read transistor, and transistor 602 (and other transistors similarly coupled between programmable resistive elements and the match line transistor) may be referred to as an isolation transistor or a cascode transistor.

Transistor 601 has a first current electrode coupled to BL1, a second current electrode coupled to node B, and a control electrode coupled to WL1. Transistor 602 has a first current electrode coupled to node B, a second current electrode coupled to node A, and a control electrode coupled to Vcas1. Transistor 603 has a first current electrode coupled to ML1, a second current electrode coupled to node VGN, and a control electrode coupled to node B. R604 (also labeled as 604) has a first terminal coupled to SL1 and a second terminal coupled to node A. R605 (also labeled as 605) has a first terminal coupled to SL2 and a second terminal coupled to node A. R606 (also labeled as 606) has a first terminal coupled to SLX1 and a second terminal coupled to node A.

Bitcell 626 is in the same column as bitcell 625 and shares BL1, SL1, SL2, and SLX1. Transistor 607 has a first current electrode coupled to BL1, a second current electrode coupled to node B, and a control electrode coupled to WL2. Transistor 608 has a first current electrode coupled to node B, a second current electrode coupled to node A, and a control electrode coupled to Vcas2. Transistor 609 has a first current electrode coupled to ML2, a second current electrode coupled to VGN, and a control electrode coupled to node B.

R610 (also labeled as 610) has a first terminal coupled to SL1 and a second terminal coupled to node A. R611 (also labeled as 611) has a first terminal coupled to SL2 and a second terminal coupled to node A. R612 (also labeled as 612) has a first terminal coupled to SLX1 and a second terminal coupled to node A.

Bitcell 627 is in the same row as bitcell 625 and shares WL1, ML1, and Vcas1. Transistor 613 has a first current electrode coupled to BL2, a second current electrode coupled to node B, and a control electrode coupled to WL1. Transistor 614 has a first current electrode coupled to node B, a second current electrode coupled to node A, and a control electrode coupled to Vcas1. Transistor 615 has a first current electrode coupled to ML1, a second current electrode coupled to VGN, and a control electrode coupled to node B. R616 (also labeled as 616) has a first terminal coupled to SL3 and a second terminal coupled to node A. R617 (also labeled as 617) has a first terminal coupled to SL4 and a second terminal coupled to node A. R618 (also labeled as 618) has a first terminal coupled to SLX2 and a second terminal coupled to node A.

Bitcell 628 is in the same row as bitcell 626 and shares WL2, ML2, and Vcas2. Bitcell 628 is also in the same column as bitcell 627 and shares BL2, SL3, SL4, and SLX2. Transistor 619 has a first current electrode coupled to BL2, a second current electrode coupled to node B, and a control electrode coupled to WL2. Transistor 620 has a first current electrode coupled to node B, a second current electrode coupled to node A, and a control electrode coupled to Vcas2. Transistor 621 has a first current electrode coupled to ML2, a second current electrode coupled to VGN, and a control electrode coupled to node B. R622 (also labeled as 622) has a first terminal coupled to SL3 and a second terminal coupled to node A. R623 (also labeled as 623) has a first terminal coupled to SL4 and a second terminal coupled to node A. R624 (also labeled as 624) has a first terminal coupled to SLX2 and a second terminal coupled to node A.

Figure 6:
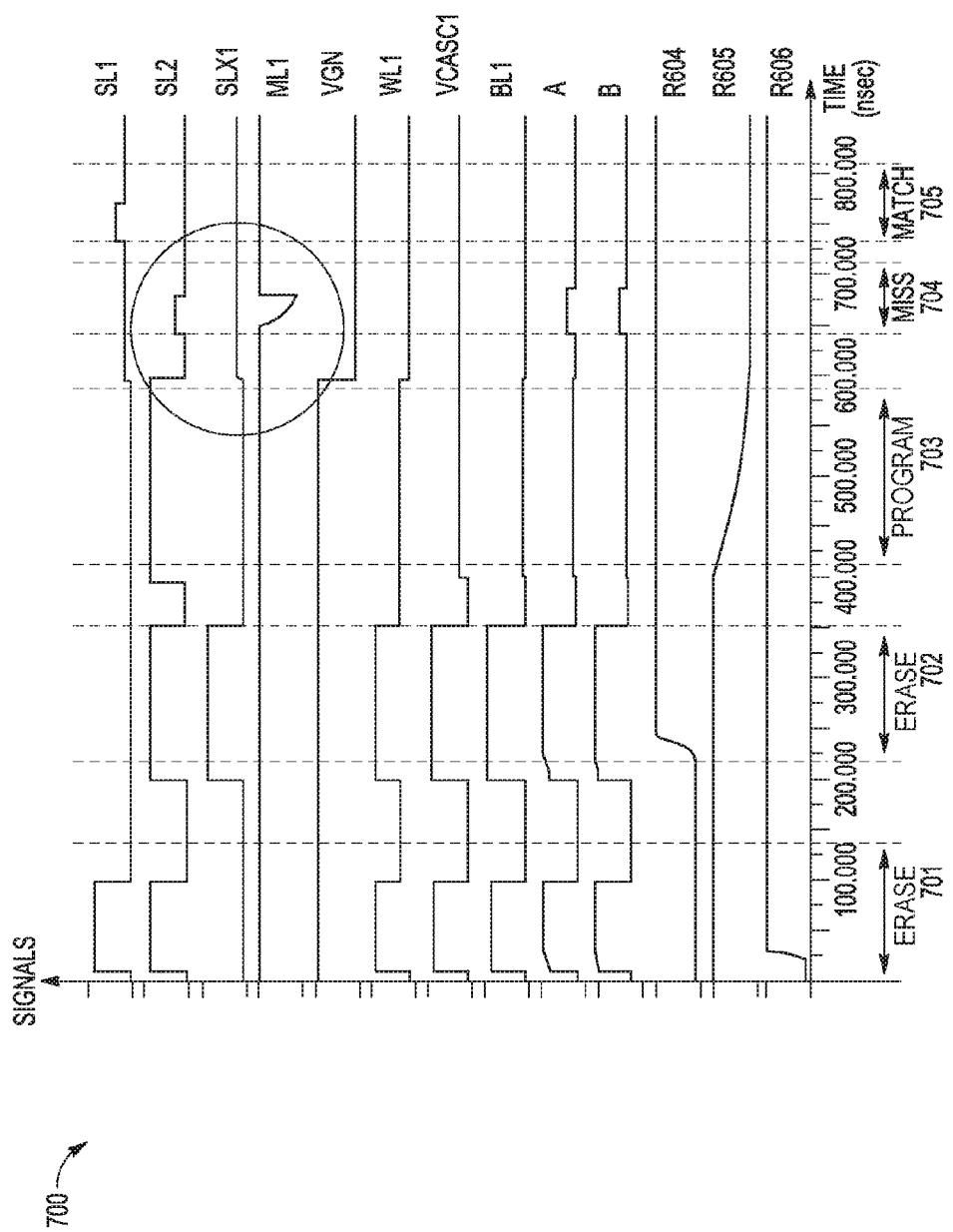
FIG. 6 illustrates a waveform diagram depicting example voltages present at a plurality of nodes in an example bitcell of the TCAM of FIG. 5 when performing various example operations, according to some embodiments.

FIG. 6 illustrates waveforms 700 of example voltages present at a plurality of nodes of an example bitcell of TCAM 600 of FIG. 5 when performing various example operations, such as writing operations, and search operations. FIG. 6 displays the example voltages over time as signals (as indicated by the axis labeled SIGNALS and the axis labeled TIME(nsec), and illustrates an example erase operation 701 (also labeled as ERASE 701), an example erase operation 702 (also labeled as ERASE 702), an example program operation 703 (also labeled as PROGRAM 703), an example search operation 704 resulting in a miss (also labeled as MISS 704), and an example search operation 705 resulting in a match (also labeled as MATCH 705). Each operation 701-705 is implemented using a respective set of voltages present at nodes in the bitcell, including SL[i], SL[j], SLX, WL, BL, Vcasc, and VGN, which produce corresponding voltages on nodes A and B. Search operations also produce a corresponding output on ML. Since the bitcells of TCAM 600 have comparable structures, FIG. 6 is discussed using bitcell 625 as an example bitcell, using the reference numbers of bitcell 625 from FIG. 5. Although example sets of voltages for each operation are discussed herein, the operations are not limited thereto.

Erase operation 701 is performed on R606 to write HRS. During erase operation 701, SL1 and SL2 are floated, Vcasc1 receives Vreset plus Vdd, and VGN is grounded. BL1 receives Vreset, and WL1 receives Vreset plus Vdd. SLX1 is grounded. Since node B is coupled to BL1 via transistor 601 (which is conducting), and node A is coupled to node B via transistor 602 (which is conducting), node B goes high and node A quickly follows to a voltage substantially equivalent to Vreset. R606 is coupled between Vreset at node A and 0V at node SLX1, which resets R606 to HRS.

Erase operation 702 is performed on R604 to write HRS. During erase operation 702, SL1 is grounded, and SL2 and SLX1 are floated. The remaining nodes receive the same voltages as described in connection with erase operation 701. Since transistors 601 and 602 are conducting, node A charges to a voltage substantially equivalent to Vreset. R604 is coupled between Vreset at node A and 0V at node SL1, which resets R604 to HRS.

Program operation 703 is performed on R605 to write LRS. During program operation 703, SL1 and SLX1 are floated and SL2 receives Vset. Vcasc1 receives Vdd. BL1 is grounded and WL1 receives Vdd. Since transistors 601 and 602 are conducting, node A charges to a voltage substantially equivalent to ground. R605 is coupled between Vset at node SL2 and ground at node A, which sets R605 to LRS.

Example writing operations are provided herein in Table 2 and are discussed using the reference numbers of FIG. 5. Each entry of table 1 indicates a respective set of voltages applied at nodes in a given bitcell, such as at bitcell 625, to write a resistive state of one of the bitcell's programmable resistive elements. The entries indicated as "float" may introduce disturb paths that limit the number of wordlines in some embodiments. It is also noted that both VGN and ML1 receive Vdd for each of the entries in Table 2.

TABLE 2

Writing operations for bitcells in TCAM 600

| Operation | BL | WL | Vcasc | SL[i] | SL[j] | SLX |
|---|---|---|---|---|---|---|
| R604 to HRS | Vreset | Vreset + Vdd | Vreset + Vdd | 0 | Float | Float |
| R604 to LRS | 0 | Vdd | Vdd | Vset | Float | Float |
| R605 to HRS | Vreset | Vreset + Vdd | Vreset + Vdd | Float | 0 | Float |
| R605 to LRS | 0 | Vdd | Vdd | Float | Vset | Float |
| R606 to HRS | Vreset | Vreset + Vdd | Vreset + Vdd | Float | Float | 0 |
| R606 to LRS | 0 | Vdd | Vdd | Float | Float | Vset |

The voltages present at nodes in other bitcells in TCAM 600 depend upon whether the other bitcells share a wordline or bitline with the bitcell being written. For example, during any of the writing operations shown in Table 2, bitcells that share the same bitline BL1 as bitcell 625 (e.g., bitcell 626 on the same bitcell column) also share the same BL1, SL1, SL2 and SLX1 voltages, while WL2 receives Vdd and Vcasc1 is grounded for bitcell 626. Similarly, bitcells that share the same wordline WL1 (e.g., bitcell 627 on the same bitcell row) also share the same WL1 and Vcasc1 voltages, while BL2, SL3, SL4, and SLX2 receive Vdd for bitcell 627. Finally, bitcells that do not share the same BL1 or WL1 (e.g., bitcell 628 that is on a different bitcell column and row) have Vcasc1 grounded, while BL2, WL2, SL3, SL4, and SLX2 receive Vdd. By grounding Vcasc of the bitcells that do not share the same bitline or wordline as the bitcell being written, any disturbance of the stored data states of those bitcells is minimized.

Returning to FIG. 6, during search (miss) operation 704, R604 is in HRS and R605 is in LRS (which represents a logic level zero state) and R606 is in HRS. In this example, SL1 receives Vb and SL2 receives Vread. Vcasc1 receives Vdd. SLX1 and BL1 receive Vb. ML1 is also precharged to a logic high level. VGN and WL1 are grounded. Since R605 (in LRS and coupled to SL2=Vread) provides a small resistance, node A fast charges to a voltage substantially equivalent to Vread. Since transistor 602 is conducting, node B follows node A and charges to a voltage substantially equivalent to Vread, turning transistor 603 on (or conducting) and pulling down ML1 to indicate a miss. A similar result (or miss) is achieved when the bitcell stores a logic level one state that does not match a logic level zero state of the input search data.

During search (match) operation 705, R604 and R606 are in HRS and R605 is in LRS. In this example, SL1 receives Vread and SL2 receives Vb (which represents a logic level zero state). Vcasc1 receives Vdd. SLX1 and BL receive Vb. ML1 is also precharged to a logic high level. VGN and WL1 are grounded. Since R605 (in LRS and coupled to SL2=Vb) provides a small resistance, node A charges to a logic low voltage. Node B follows node A and charges to a voltage that remains low enough to keep transistor 603 off (or non-conducting), and ML1 remains high to indicate a match.

It is also noted that the chart of FIG. 4 also illustrates example resistive states and associate search results of TCAM 600, with the addition of Vcasc1 being set to Vdd for each entry of the chart.

By now it should be appreciated that there has been provided a ternary content addressable memory (TCAM) that utilizes resistive RAM (RRAM) technology to store data in a non-volatile manner. In one embodiment of the present disclosure, a content addressable memory device is provided, which includes a first memory cell including: a first programmable resistive element including a first terminal and a second terminal; a second programmable resistive element including a first terminal and a second terminal; a third programmable resistive element including a first terminal and a second terminal; the first, second, and third programmable resistive elements are coupled in parallel, the first terminals of the first, second, and third programmable resistive elements are coupled to a first node, the second terminal of the first programmable resistive element is coupled to a first source line voltage, the second terminal of the second programmable resistive element is coupled to a second source line voltage, and the second terminal of the third programmable resistive element is coupled to a first supply voltage; a first access transistor including a first current electrode coupled to a bit line; a second current electrode coupled to the first node, and a control electrode coupled to a word line; and a match line transistor including a first current electrode coupled to a match line; a second current electrode coupled to a second supply voltage and a control electrode coupled to the first node.

One aspect of the above embodiment provides that the first memory cell further includes: a second access transistor including a first current electrode coupled to the first node, a second current electrode coupled to the control electrode of the match line transistor, and a control electrode coupled to a third supply voltage.

Another aspect of the above embodiment provides that the first memory cell further includes: a second access transistor coupled in cascode with the first access transistor, the second access transistor including a first current electrode coupled to the first node, a second current electrode coupled to the control electrode of the match line transistor and to the second current electrode of the first access transistor, and a control electrode coupled to a third supply voltage.

A further aspect of the above embodiment provides that the first access transistor is a dual gate oxide transistor and the second access transistor and the match line transistor are low voltage transistors.

A still further aspect of the above embodiment provides that the first and second access transistors and the match line transistor are low voltage transistors.

Another aspect of the above embodiment provides that the content addressable memory device of claim 1 further includes a second memory cell including: a first programmable resistive element including a first terminal and a second terminal; a second programmable resistive element including a first terminal and a second terminal; a third programmable resistive element including a first terminal and a second terminal; the first, second, and third programmable resistive elements of the second memory cell are coupled in parallel, the first terminals of the first, second, and third programmable resistive elements of the second memory cell are coupled to a first node of the second memory cell, the second terminal of the first programmable resistive element of the second memory cell is coupled to a third source line voltage, the second terminal of the second programmable resistive element of the second memory cell is coupled to a fourth source line voltage, and the second terminal of the third programmable resistive element of the second memory cell is coupled to the first supply voltage; a first access transistor including a first current electrode coupled to the bit line; a second current electrode coupled to the first node of the second memory cell, and a control electrode coupled to a second word line; and a match line transistor including a first current electrode coupled to a second match line; a second current electrode coupled to the second supply voltage and a control electrode coupled to the first node of the second memory cell.

A further aspect of the above embodiment provides that the content addressable memory device of claim 6 further includes a third memory cell including: a first programmable resistive element including a first terminal and a second terminal; a second programmable resistive element including a first terminal and a second terminal; a third programmable resistive element including a first terminal and a second terminal; the first, second, and third programmable resistive elements of the third memory cell are coupled in parallel, the first terminals of the first, second, and third programmable resistive elements of the third memory cell are coupled to a first node of the third memory cell, the second terminal of the first programmable resistive element of the third memory cell is coupled to a fifth source line voltage, the second terminal of the second programmable resistive element of the third memory cell is coupled to a sixth source line voltage, and the second terminal of the third programmable resistive element of the third memory cell is coupled to a third supply voltage; a first access transistor including a first current electrode coupled to a second bit line; a second current electrode coupled to the first node of the third memory cell, and a control electrode coupled to the first word line; and a match line transistor including a first current electrode coupled to the first match line; a second current electrode coupled to the second supply voltage and a control electrode coupled to the first node of the third memory cell.

Another aspect of the above embodiment provides that a voltage on the match line indicates a data match during a read operation when the first programmable resistive element is in a high resistance state, the second programmable resistive element is in a low resistance state, the third programmable resistive element is in an intermediate resistance state, and the first source line voltage is high.

Another aspect of the above embodiment provides that a voltage on the match line indicates a data mismatch during a read operation when the first programmable resistive element is in a high resistance state, the second programmable resistive element is in a low resistance state, the third programmable resistive element is in an intermediate resistance state, and the first source line voltage is low.

Another aspect of the above embodiment provides that resistance of the third programmable resistive element is approximately one-half a resistance of the first programmable resistive element when the first programmable resistive element is in a high resistance state.

In another embodiment of the present disclosure, a nonvolatile content addressable memory (CAM) device is provided, which includes an array of memory cells, wherein a first memory cell of the array of memory cells includes: three programmable resistive elements, wherein a first terminal of each of the three programmable resistive elements is coupled to a first node, a second terminal of a first of the three programmable resistive elements is coupled to a first source line voltage, a second terminal of a second of the three programmable resistive elements is coupled to a second source line voltage, and a second terminal of a third of the three programmable resistive elements is coupled to a first supply voltage, a first access transistor including a first current electrode coupled to a first bit line, a second current electrode coupled to the first node, and a control electrode coupled to a first word line; and a match line transistor (including a first current electrode coupled to a second supply voltage, a second current electrode coupled to a match line, and a control electrode coupled to the first node, wherein a constant resistance of the third of the programmable resistive elements is less than a resistance of a high resistance state of one of the first and second of the programmable resistive elements.

One aspect of the above embodiment provides that the resistance of the third of the programmable resistive elements is approximately one-half of the resistance of the high resistance state.

Another aspect of the above embodiment provides that the first memory cell stores a "1" after the first of the programmable resistive elements is placed in the high resistance state while the constant resistance of the third of the programmable resistive elements is maintained and the second of the programmable resistive elements is floating, and after the first of the programmable resistive elements is in the high resistance state, the second of the programmable resistive elements is placed in a low resistance state while the constant resistance of the third of the programmable resistive elements is maintained and the first of the programmable resistive elements is floating.

Another aspect of the above embodiment provides that the first memory cell stores a "0" after the second of the programmable resistive elements is placed in the high resistance state while the constant resistance of the third of the programmable resistive elements is maintained and the first of the programmable resistive elements is floating, and after the second of the programmable resistive elements is in the high resistance state, the first of the programmable resistive elements is placed in a low resistance state while the constant resistance of the third of the programmable resistive elements is maintained and the second of the programmable resistive elements is floating.

Another aspect of the above embodiment provides that the first memory cell indicates a data match during a read operation when the first of the programmable resistive elements is in a high resistance state, the second of the programmable resistive elements is in a low resistance state, resistance of the third of the programmable resistive elements is at the constant resistance, and the source line voltage is high.

Another aspect of the above embodiment provides that the first memory cell indicates a data mismatch during a read operation when the first of the programmable resistive elements is in a high resistance state, the second of the programmable resistive elements is in a low resistance state, resistance of the third of the programmable resistive elements is at the constant resistance, and the source line voltage is low.

Another aspect of the above embodiment provides that the first access transistor is a dual gate oxide transistor and the second access transistor and the match line transistor are low voltage transistors.

Another aspect of the above embodiment provides that the first access transistor and the match line transistor are low voltage transistors.

Another aspect of the above embodiment provides that the CAM device further includes a first data line transistor including a first current electrode coupled to a second supply voltage, a second current electrode coupled to supply the first source line voltage, and a control electrode coupled to a data line voltage; a second data line transistor including a first current electrode coupled to the second supply voltage, a second current electrode coupled to supply the second source line voltage, and a control electrode coupled to a complement of the data line voltage.

A further aspect of the above embodiment provides that the array of memory cells includes a column of memory cells, and the first and second data line transistors are coupled to supply the first and second source line voltages to each of the memory cells in the column.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A content addressable memory device comprising:
    a first memory cell including:
        a first programmable resistive element including a first terminal and a second terminal;
        a second programmable resistive element including a first terminal and a second terminal;
        a third programmable resistive element including a first terminal and a second terminal; wherein
            the first terminals of the first, second, and third programmable resistive elements are coupled to a first node,
            the second terminal of the first programmable resistive element is coupled to a first source line voltage,
            the second terminal of the second programmable resistive element is coupled to a second source line voltage, and
            the second terminal of the third programmable resistive element is coupled to a first supply voltage;
        a first access transistor including a first current electrode coupled to a bit line, a second current electrode coupled to the first node, and a control electrode coupled to a word line; and
        a match line transistor including a first current electrode coupled to a match line, a second current electrode coupled to a second supply voltage, and a control electrode coupled to the first node.

2. The content addressable memory device of claim 1, wherein the first memory cell further includes:
    a second access transistor including a first current electrode coupled to the first node, a second current electrode coupled to the control electrode of the match line transistor, and a control electrode coupled to a third supply voltage.

3. The content addressable memory device of claim 1, wherein the first memory cell further includes:
    a second access transistor coupled in cascode with the first access transistor, the second access transistor including a first current electrode coupled to the first node, a second current electrode coupled to the control electrode of the match line transistor and to the second current electrode of the first access transistor, and a control electrode coupled to a third supply voltage.

4. The content addressable memory device of claim 2, wherein:
    the first access transistor is a dual gate oxide transistor and the second access transistor and the match line transistor are low voltage transistors.

5. The content addressable memory device of claim 3, wherein:
    the first and second access transistors and the match line transistor are low voltage transistors.

6. The content addressable memory device of claim 1 further comprising:
    a second memory cell including:
        a first programmable resistive element including a first terminal and a second terminal;
        a second programmable resistive element including a first terminal and a second terminal;
        a third programmable resistive element including a first terminal and a second terminal; wherein
            the first terminals of the first, second, and third programmable resistive elements of the second memory cell are coupled to a first node of the second memory cell,
            the second terminal of the first programmable resistive element of the second memory cell is coupled to a third source line voltage,
            the second terminal of the second programmable resistive element of the second memory cell is coupled to a fourth source line voltage, and
            the second terminal of the third programmable resistive element of the second memory cell is coupled to the first supply voltage;
        a first access transistor including a first current electrode coupled to the bit line, a second current electrode coupled to the first node of the second memory cell, and a control electrode coupled to a second word line; and
        a match line transistor including a first current electrode coupled to a second match line, a second current electrode coupled to the second supply voltage and a control electrode coupled to the first node of the second memory cell.

7. The content addressable memory device of claim 6 further comprising:
a third memory cell including:
a first programmable resistive element including a first terminal and a second terminal;
a second programmable resistive element including a first terminal and a second terminal;
a third programmable resistive element including a first terminal and a second terminal; wherein
the first terminals of the first, second, and third programmable resistive elements of the third memory cell are coupled to a first node of the third memory cell,
the second terminal of the first programmable resistive element of the third memory cell is coupled to a fifth source line voltage,
the second terminal of the second programmable resistive element of the third memory cell is coupled to a sixth source line voltage, and
the second terminal of the third programmable resistive element of the third memory cell is coupled to a third supply voltage;
a first access transistor including a first current electrode coupled to a second bit line, a second current electrode coupled to the first node of the third memory cell, and a control electrode coupled to the first word line; and
a match line transistor including a first current electrode coupled to the first match line, a second current electrode coupled to the second supply voltage and a control electrode coupled to the first node of the third memory cell.

8. The content addressable memory device of claim 1 wherein:
a voltage on the match line indicates a data match during a read operation when the first programmable resistive element is in a high resistance state, the second programmable resistive element is in a low resistance state, the third programmable resistive element is in an intermediate resistance state, and the first source line voltage is high.

9. The content addressable memory device of claim 1 wherein:
a voltage on the match line indicates a data mismatch during a read operation when the first programmable resistive element is in a high resistance state, the second programmable resistive element is in a low resistance state, the third programmable resistive element is in an intermediate resistance state, and the first source line voltage is low.

10. The content addressable memory device of claim 1 wherein:
resistance of the third programmable resistive element is approximately one-half a resistance of the first programmable resistive element when the first programmable resistive element is in a high resistance state.

11. A non-volatile content addressable memory (CAM) device comprising:
an array of memory cells, wherein a first memory cell of the array of memory cells includes:
three programmable resistive elements, wherein
a first terminal of each of the three programmable resistive elements is coupled to a first node,
a second terminal of a first of the three programmable resistive elements is coupled to a first source line voltage,
a second terminal of a second of the three programmable resistive elements is coupled to a second source line voltage, and
a second terminal of a third of the three programmable resistive elements is coupled to a first supply voltage,
a first access transistor including a first current electrode coupled to a first bit line, a second current electrode coupled to the first node, and a control electrode coupled to a first word line; and
a match line transistor including a first current electrode coupled to a second supply voltage, a second current electrode coupled to a match line, and a control electrode coupled to the first node,
wherein a constant resistance of the third of the programmable resistive elements is less than a resistance of a high resistance state of one of the first and second of the programmable resistive elements.

12. The CAM device of claim 11 wherein the resistance of the third of the programmable resistive elements is approximately one-half of the resistance of the high resistance state.

13. The CAM device of claim 11 wherein:
the first memory cell stores a "1" after
the first of the programmable resistive elements is placed in the high resistance state while the constant resistance of the third of the programmable resistive elements is maintained and the second of the programmable resistive elements is floating, and
after the first of the programmable resistive elements is in the high resistance state, the second of the programmable resistive elements is placed in a low resistance state while the constant resistance of the third of the programmable resistive elements is maintained and the first of the programmable resistive elements is floating.

14. The CAM device of claim 11 further comprising:
the first memory cell stores a "0" after
the second of the programmable resistive elements is placed in the high resistance state while the constant resistance of the third of the programmable resistive elements is maintained and the first of the programmable resistive elements is floating, and
after the second of the programmable resistive elements is in the high resistance state, the first of the programmable resistive elements is placed in a low resistance state while the constant resistance of the third of the programmable resistive elements is maintained and the second of the programmable resistive elements is floating.

15. The CAM device of claim 11 wherein:
the first memory cell indicates a data match during a read operation when the first of the programmable resistive elements is in a high resistance state, the second of the programmable resistive elements is in a low resistance state, resistance of the third of the programmable resistive elements is at the constant resistance, and the source line voltage is high.

16. The CAM device of claim 11 wherein:
the first memory cell indicates a data mismatch during a read operation when the first of the programmable resistive elements is in a high resistance state, the second of the programmable resistive elements is in a low resistance state, resistance of the third of the programmable resistive elements is at the constant resistance, and the source line voltage is low.

17. The CAM device of claim 11 wherein:
the first access transistor is a dual gate oxide transistor and the second access transistor and the match line transistor are low voltage transistors.

18. The CAM device of claim 11, wherein:
the first access transistor and the match line transistor are low voltage transistors.

19. The CAM device of claim 11 further comprising:
a first data line transistor including a first current electrode coupled to a second supply voltage, a second current electrode coupled to supply the first source line voltage, and a control electrode coupled to a data line voltage;
a second data line transistor including a first current electrode coupled to the second supply voltage, a second current electrode coupled to supply the second source line voltage, and a control electrode coupled to a complement of the data line voltage.

20. The CAM device of claim 19 further comprising:
the array of memory cells includes a column of memory cells, and the first and second data line transistors are coupled to supply the first and second source line voltages to each of the memory cells in the column.

* * * * *